(12) United States Patent
Topacio et al.

(10) Patent No.: US 8,647,974 B2
(45) Date of Patent: Feb. 11, 2014

(54) METHOD OF FABRICATING A SEMICONDUCTOR CHIP WITH SUPPORTIVE TERMINAL PAD

(75) Inventors: Roden R. Topacio, Markham (CA); Michael Z. Su, Round Rock, TX (US); Neil McLellan, Toronto (CA)

(73) Assignees: ATI Technologies ULC, Markham (CA); Advanced Micro Devices, Inc., Sunnyvale, CA (US)

( * ) Notice: Subject to any disclaimer, the term of this patent is extended or adjusted under 35 U.S.C. 154(b) by 164 days.

(21) Appl. No.: 13/072,554

(22) Filed: Mar. 25, 2011

(65) Prior Publication Data

US 2012/0241985 A1   Sep. 27, 2012

(51) Int. Cl.
*H01L 21/44* (2006.01)
*H01L 23/48* (2006.01)

(52) U.S. Cl.
USPC ........... 438/612; 257/773; 257/780; 257/766; 257/E23.037

(58) Field of Classification Search
None
See application file for complete search history.

(56) References Cited

U.S. PATENT DOCUMENTS

| | | | |
|---|---|---|---|
| 3,615,913 A | 10/1971 | Shaw | |
| 4,034,469 A | 7/1977 | Koopman et al. | |
| 5,726,501 A * | 3/1998 | Matsubara | 257/778 |
| 5,912,505 A * | 6/1999 | Itoh et al. | 257/737 |
| 6,118,180 A * | 9/2000 | Loo et al. | 257/737 |
| 6,455,408 B1 * | 9/2002 | Hwang et al. | 438/613 |
| 6,762,510 B2 * | 7/2004 | Fock et al. | 257/787 |
| 7,064,436 B2 * | 6/2006 | Ishiguri et al. | 257/738 |
| 7,098,540 B1 * | 8/2006 | Mohan et al. | 257/773 |
| 7,790,501 B2 | 9/2010 | Topacio | |
| 7,839,000 B2 * | 11/2010 | Mis et al. | 257/781 |
| 7,973,408 B2 | 7/2011 | Topacio | |
| 8,350,385 B2 * | 1/2013 | Hochstenbach | 257/738 |
| 2004/0056351 A1 | 3/2004 | Wu et al. | |
| 2007/0063352 A1 | 3/2007 | Archer, III et al. | |
| 2007/0194445 A1 | 8/2007 | Aiba | |
| 2007/0290343 A1 * | 12/2007 | Harada et al. | 257/737 |
| 2009/0032941 A1 | 2/2009 | McLellan et al. | |
| 2009/0108448 A1 | 4/2009 | Lee | |
| 2010/0072632 A1 | 3/2010 | Yu et al. | |
| 2011/0221065 A1 * | 9/2011 | Topacio et al. | 257/773 |

FOREIGN PATENT DOCUMENTS

JP    6163629      6/1994
JP    200788478    4/2007

OTHER PUBLICATIONS

Guotao Wang et. al.; *Chip packaging interaction: a critical concern for Cu/low k packaging*; www.sciencedirect.com; Microelectronics Reliability 45 (2005) 1079-1093.

Marie-Claude Paquet et al.; *Underfill Selection Strategy for Pb-Free, Low-K and Fine Pitch Organic Flip Chip Applications*; 2006 Electronic Components and Technology Conference; 1-4244-0152-6/06/ $20.00 © 2006 IEEE; pp. 1595-1603.

(Continued)

Primary Examiner — Alonzo Chambliss
(74) Attorney, Agent, or Firm — Timothy M. Honeycutt (57) ABSTRACT

Various semiconductor chip input/output structures and methods of making the same are disclosed. In one aspect, a method of manufacturing is provided that includes providing a semiconductor chip that has a first conductor pad and a passivation structure. A second conductor pad is fabricated around but not in physical contact with the first conductor pad to leave a gap. The second conductor pad is adapted to protect a portion of the passivation structure.

24 Claims, 8 Drawing Sheets

(56) References Cited

OTHER PUBLICATIONS

John Baliga; *Yet Another Way to Use BCB*; Semiconductor International; http://www.semiconductor.net/article/CA6347341.html; Jul. 1, 2006; pp. 1-3.

Stanley Wolf and Richard N. Tauber; *Silicon Processing for the VLSI Era, vol. 2—Process Integration*; pp. 273-276 and 337; 1990.

PCT/US2012/027631 International Search Report mailed Jul. 6, 2012.

* cited by examiner

METHOD OF FABRICATING A SEMICONDUCTOR CHIP WITH SUPPORTIVE TERMINAL PAD

BACKGROUND OF THE INVENTION

1. Field of the Invention

This invention relates generally to semiconductor processing, and more particularly to semiconductor chip solder bump pads and methods of making the same.

2. Description of the Related Art

Flip-chip mounting schemes have been used for decades to mount semiconductor chips to circuit boards, such as semiconductor chip package substrates. In many conventional flip-chip variants, a plurality of solder joints are established between input/output (I/O) sites of a semiconductor chip and corresponding I/O sites of a circuit board. In one conventional process, a solder bump is metallurgically bonded to a given I/O site or pad of the semiconductor chip and a so-called pre-solder is metallurgically bonded to a corresponding I/O site of the circuit board. Thereafter the solder bump and the pre-solder are brought into proximity and subjected to a heating process that reflows one or both of the solder bump and the pre-solder to establish the requisite solder joint.

In one conventional process, the connection of the solder bump to a particular I/O site of a semiconductor chip entails forming an opening in a top-level dielectric film of a semiconductor chip proximate the I/O site and thereafter depositing metal to establish an underbump metallization (UBM) structure. The solder bump is then metallurgically bonded to the UBM structure by reflow. This conventional UBM structure includes a base, a sidewall and an upper flange that is positioned on the dielectric film.

Flip-chip solder joints may be subjected to mechanical stresses from a variety of sources, such as coefficient of thermal expansion mismatches, ductility differences and circuit board warping. Such stresses can subject the just described conventional UBM structure to bending moments. The effect is somewhat directional in that the stresses tend to be greatest nearer the die edges and corners and fall off with increasing proximity to the die center. The bending moments associated with this so-called edge effect can impose stresses on the dielectric film beneath the UBM structure that, if large enough, can produce fracture.

For a variety of reasons, designers have begun to turn to lead-free solders for solder joint fabrication. Bumps composed from such solders may produce higher stresses than comparably sized lead-based bumps. To compensate for these higher stresses, a conventional design incorporates a terminal pad between the underbump metallization and the underlying chip bump pad. The terminal pad has a larger footprint than the overlying underbump metallization and the underlying chip pad to provide stress protection for the passivation layer. If the chip includes active traces proximate the chip pad, the terminal pad may overlap such traces and give rise to parasitics.

The present invention is directed to overcoming or reducing the effects of one or more of the foregoing disadvantages.

SUMMARY OF EMBODIMENTS OF THE INVENTION

In accordance with one aspect of an embodiment of the present invention, a method of manufacturing is provided that includes providing a semiconductor chip that has a first conductor pad and a passivation structure. A second conductor pad is fabricated around but not in physical contact with the first conductor pad to leave a gap. The second conductor pad is adapted to protect a portion of the passivation structure.

In accordance with another aspect of an embodiment of the present invention, a method of coupling a semiconductor chip to a circuit board is provided. The semiconductor chip has a passivation structure, first and second conductor pads proximate to each other but separated by a polymer layer to leave a gap, the first conductor pad in electrical contact with an underbump metallization structure that extends over the second conductor pad but is separated therefrom by the polymer layer. The method includes coupling a solder structure to the underbump metallization structure and coupling the solder structure to the circuit board.

In accordance with another aspect of an embodiment of the present invention, an apparatus is provided that includes a semiconductor chip that has a first conductor pad and a passivation structure. A second conductor pad is around but not in physical contact with the first conductor pad to leave a gap. The second conductor pad is adapted to protect a portion of the passivation structure.

BRIEF DESCRIPTION OF THE DRAWINGS

The foregoing and other advantages of the invention will become apparent upon reading the following detailed description and upon reference to the drawings in which.

DETAILED DESCRIPTION OF SPECIFIC EMBODIMENTS

Various embodiments of a semiconductor chip are described herein. One example includes solder bump connection structures, such as UBM structures, fabricated on respective active terminal pads. The active terminal pads are fabricated on the chip passivation structure with surrounding virtual pads, which are not physically connected to the active terminal pads. The virtual pads provide protection to the passivation structure without giving rise to parasitic capacitances associated with underlying chip active conductor traces. Additional details will now be described.

Figure 1:
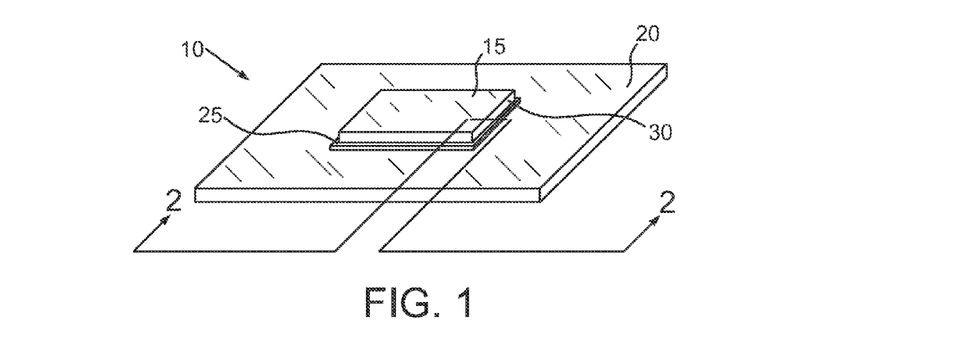
FIG. 1 is a pictorial view of an exemplary embodiment of a semiconductor chip device that includes a semiconductor chip mounted on a circuit board.

In the drawings described below, reference numerals are generally repeated where identical elements appear in more than one figure. Turning now to the drawings, and in particular to FIG. 1, therein is shown a pictorial view of an exemplary embodiment of a semiconductor chip device 10 that includes a semiconductor chip 15 mounted on a circuit board 20. An underfill material layer 25 is positioned between the semiconductor chip 15 and the circuit board 20. The solder interconnect structures disclosed herein are not dependent on particular functionalities of either the semiconductor chip 15 or the circuit board 20. Thus, the semiconductor chip 15 may be any of a myriad of different types of circuit devices used in electronics, such as, for example, microprocessors, graphics processors, combined microprocessor/graphics processors, application specific integrated circuits, memory devices or the like, and may be single or multi-core or even stacked with additional dice. The semiconductor chip 15 may be constructed of bulk semiconductor, such as silicon or germanium, or semiconductor on insulator materials, such as silicon-on-insulator materials. The semiconductor chip 15 may be flip-chip mounted to the circuit board 20 and electrically connected thereto by solder joints or other structures (not visible in FIG. 1 but shown in subsequent figures).

The circuit board 20 may be a semiconductor chip package substrate, a circuit card, or virtually any other type of printed circuit board. Although a monolithic structure could be used for the circuit board 20, a more typical configuration will utilize a build-up design. In this regard, the circuit board 20 may consist of a central core upon which one or more build-up layers are formed and below which an additional one or more build-up layers are formed. The core itself may consist of a stack of one or more layers. One example of such an arrangement may be termed a so called "2-2-2" arrangement where a single-layer core is laminated between two sets of two build-up layers. If implemented as a semiconductor chip package substrate, the number of layers in the circuit board 20 can vary from four to sixteen or more, although less than four may be used. So-called "coreless" designs may be used as well. The layers of the circuit board 20 may consist of an insulating material, such as various well-known epoxies, interspersed with metal interconnects. A multi-layer configuration other than buildup could be used. Optionally, the circuit board 20 may be composed of well-known ceramics or other materials suitable for package substrates or other printed circuit boards.

The circuit board 20 is provided with a number of conductor traces and vias and other structures in order to provide power, ground and signals transfers between the semiconductor chip 15 and another circuit device that is not shown. To facilitate those transfers, the circuit board 20 may be provided with input/outputs in the form of a pin grid array, a ball grid array, a land grid array or other type of interconnect scheme.

Additional details of the semiconductor chip 15 will be described in conjunction with FIG. 2, which is a sectional view of FIG. 1 taken at section 2-2. Before turning to FIG. 2, it will be helpful to note the exact location of the portion of the package 10 that will be shown in section. Note that section 2-2 passes through a small portion of the semiconductor chip 15 that includes an edge 30. With that backdrop, attention is now turned to FIG. 2. As noted above, the semiconductor chip 15 may be configured as a bulk semiconductor or a semiconductor-on-insulator configuration. In this illustrative embodiment, the semiconductor chip 15 is implemented as a bulk semiconductor that includes a bulk semiconductor layer 35, and a semiconductor device layer 40. The semiconductor device layer 40 includes the various circuits that provide the functionality for the semiconductor chip 15 and will typically include plural metallization and/or other types of conductor layers that facilitate the transfer of power, ground and signals to and from the semiconductor chip 15. A passivation structure 45 is formed on the semiconductor device layer 40 and may consist of multiple layers of insulating material. More details regarding the passivation structure 45 will be described in conjunction with a subsequent figure. The semiconductor chip 15 may be flip-chip mounted to the carrier substrate 20 and electrically connected thereto by way of a plurality of solder structures or joints, two of which are visible and labeled 50 and 55 respectively. Only a portion of the solder joint 55 is visible due to the positioning of section 2-2.

The underfill material layer 25 is dispersed between the semiconductor chip 15 and the substrate 20 to reduce the effects of differences in the coefficients of thermal expansion (CTE) of the semiconductor chip 15, the solder joints 50, 55 etc. and the circuit board 20. The underfill material layer 25 may be, for example, an epoxy resin mixed with silica fillers and phenol resins, and deposited before or after the re-flow process to establish the solder joints 50 and 55. A suitable thermal cure may be used.

The following description of the solder joint 50 will be illustrative of the other solder joints as well. The solder joint 50 includes a solder structure or bump 60 that is metallurgically bonded to another solder structure 65 that is sometimes referred to as a pre-solder. The solder bump 60 and the pre-solder 65 are metallurgically joined by way of a solder re-flow process. The irregular line 70 denotes the hypothetical border between the solder bump 60 and pre-solder 65 following the re-flow. However, the skilled artisan will appreciate that such a border 70 is seldom that readily visible even during microscopic examination. The solder bump 60 may be composed of various lead-based or lead-free solders. An exemplary lead-based solder may have a composition at or near eutectic proportions, such as about 63% Sn and 37% Pb. Lead-free examples include tin-silver (about 97.3% Sn 2.7% Ag), tin-copper (about 99% Sn 1% Cu), tin-silver-copper (about 96.5% Sn 3% Ag 0.5% Cu) or the like. The pre-solder 65 may be composed of the same types of materials. Optionally, the pre-solder 65 may be eliminated in favor of a single solder structure or a solder plus a conducting post arrangement.

The solder bump 60 may be metallurgically connected to a conductor structure 75 that is alternatively termed an under-bump metallization or UBM structure. A portion of the UBM structure 75 projects through a polymer film 80 positioned on the passivation structure 45 and is in ohmic contact with a conductor or active terminal pad 85. Another portion of the UBM structure 75 is seated on an outer surface of the polymer film 80. The polymer film 80 is designed to provide a compliant protective film and thus may be composed of a variety of materials, such as polyimide, benzocyclobutene or the like. The active terminal pad 85 is electrically connected to another conductor structure or pad 90 in the chip 15 that may be part of the plural metallization layers in the semiconductor chip 15. Indeed, a few such conductors or traces are visible and labeled 95, 100 and 105, respectively. The conductor pad 85 may be used as an input/output site for power, ground or signals or may be used as a dummy pad that is not electrically tied to other structures. The pre-solder 65 is similarly metallurgically bonded to a conductor 110 that is bordered laterally by a solder mask 115. The conductor structure 110 may form part of what may be multiple layers of conductor structures and interconnected by vias and surrounded by dielectric material layers (not shown).

The active terminal pad 85 has some lateral dimension $X_1$ that will vary with process technologies. In conventional designs, the active terminal pad 85 would be provided with a much larger lateral dimension $X_2$ in order to help counteract mechanical stresses imposed by the solder bump 60 and joint 50 on the passivation structure 45. These stresses can be particularly high for lead-free solders. If the stresses are severe enough, the passivation structure 45 can fracture, leading to a host of potential problems. However, if the active terminal pad 85 is fabricated with such a wide lateral dimension $X_2$, then overlaps with the conductor traces 100 and 105 of the semiconductor chip 15 are established, which can give rise to parasitic capacitances and corresponding reductions in electrical performance. To provide sufficient stress protection for the passivation structure 45 without causing significant parasitic capacitances, the active terminal pad 85 is constructed with a lateral dimension $X_1$, and thus without overlap with the conductor traces 100 and 105. In addition, the active terminal pad 85 is surrounded laterally by a conductor or virtual pad 120 that is separated from the active terminal pad by a gap 125. The virtual pad 120 is electrically insulated from the active terminal pad 85. In this case the electrical insulation is provided by the portion of the polymer film 80 in the gap 125. The virtual pad 120 may be floating or coupled to power or ground as desired.

A variety of physical processes may lead to the stresses imposed on the passivation structure 45. One cause is differences in strain rate between the semiconductor chip 15, the circuit board 20 and the underfill material layer 25 during thermal cycling. Another contributor to the differential stresses may be ductility differences between the solder bump 60 and the pre-solder 65. Due to a phenomena known as edge effect, these differential stresses and resultant strains may be greatest proximate the edge 30 of the semiconductor chip 15 and may progressively lessen in the direction indicated by the arrow 130 projecting away from the edge 30 and towards the center of the semiconductor chip 15.

Figure 2:
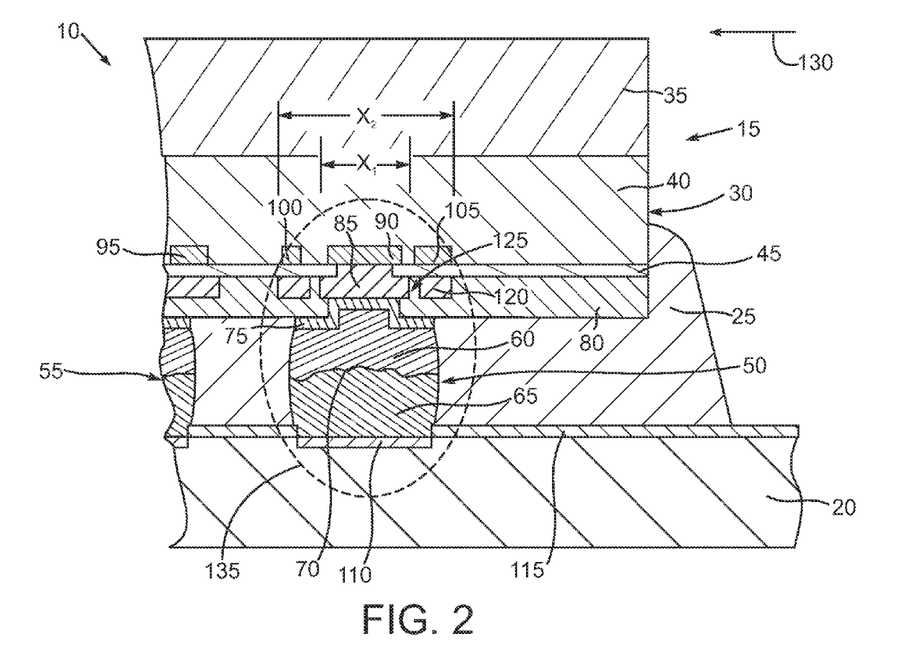
FIG. 2 is a sectional view of FIG. 1 taken at section 2-2.
Figure 3:
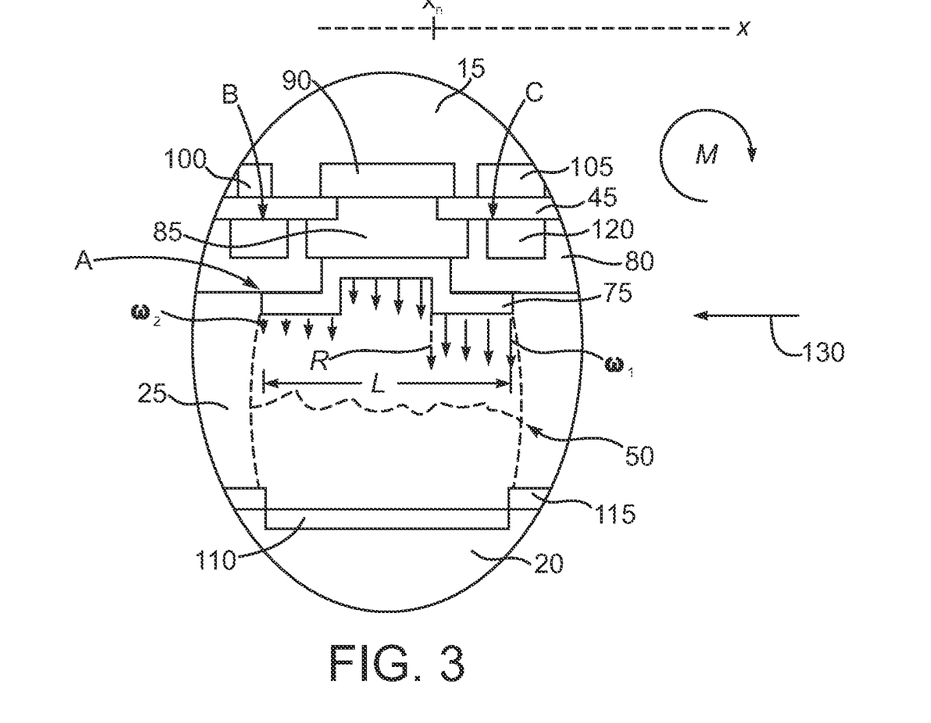
FIG. 3 is a portion of FIG. 2 shown at greater magnification.

To aid in the description of some exemplary physical forces leading to passivation structure stresses, the portion of FIG. 2 circumscribed by the dashed oval 135 will be shown at greater magnification in FIG. 3. Although FIG. 3 is a sectional view, cross hatching is not shown so that the various forces that are exerted against the pertinent structures may be more clearly depicted. Here, the following features are visible: a small portion of a semiconductor chip 15, the bump pad 90, the passivation structure 45, the polymer film 80, active terminal pad 85, the virtual pad 120, the UBM structure 75, the underfill material layer 25, the solder mask 115, the conductor pad 110 and a small portion of the circuit board 20. The solder joint 50 is shown as a dashed figure. The direction to the center of the semiconductor chip 15 is indicated by the arrow 130.

Due to warping of the substrate 20 during manufacture, reliability testing or device operation and principally due to CTE mismatch, the substrate 20 through the solder joint 50 imparts a distributed load represented schematically by the series of downwardly pointing arrows. The distributed load varies in intensity from a maximum $\omega_1$ to a minimum $\omega_2$ along a length L where $\omega_1$ and $\omega_2$ are in units of force per unit length. The resultant R of the distributed load is located at point $x_n$ on the x-axis. The distributed load acting on the UBM structure 75 appears as a line distribution since FIG. 3 is a sectional view. In practice, the distributed load will be an area distribution. The gradual decrease in the force intensity $\omega_1$ to $\omega_2$ as a function of the distance along the x-axis in the direction 130 toward the center is due to the edge effect described in the Background section hereof. The position of the resultant R relative to the corner point A produces a moment M acting on the UBM structure 75 about corner point A. The corner point A can act as a pivot point for unwanted pivoting movement of the UBM structure 75 downward and about point A depending upon the ductility of the UBM structure 75 and the distance L. Due to the moment M, the area B of the passivation structure 45 may be in compression and the opposite area C may be in tension. However, the presence of the virtual pad 120 provides stress protection for areas B and C.

Figure 4:
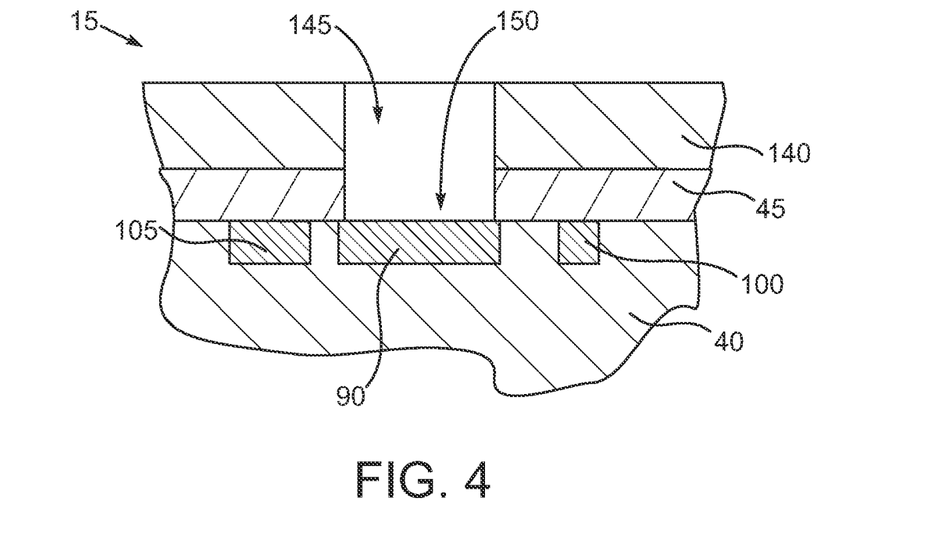
FIG. 4 is a sectional view depicting an exemplary formation of an opening to a conductor structure of a semiconductor chip.
Figure 5:
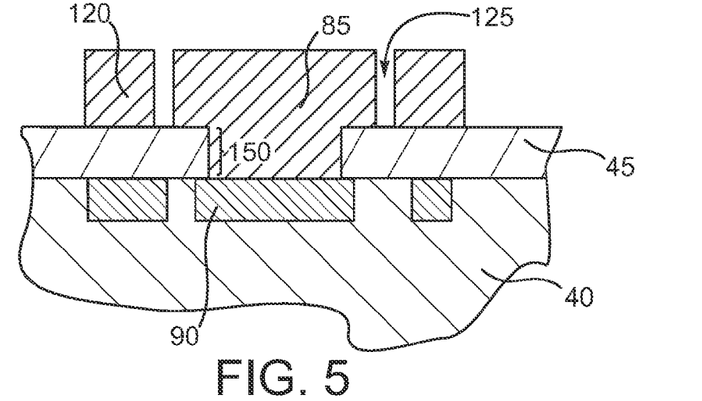
FIG. 5 is a sectional view like FIG. 4, but depicting fabrication of exemplary active terminal and virtual pads.

An exemplary method for fabricating the exemplary UBM structure 75 may be understood by referring now to FIGS. 4, 5, 6, 7, 8, 9, 10 and 11 and initially to FIG. 4. FIG. 4 is a sectional view that shows a small portion of the semiconductor device layer 40 of the semiconductor chip 15, the conductor pad 90 and traces 100 and 105, and the passivation structure 45. It should be understood that FIG. 4 depicts the semiconductor device layer 40 and the conductor pad 90 flipped over from the orientation depicted in FIGS. 2 and 3. It should also be understood that the process described herein could by performed at the wafer level or on a die by die basis. At this stage, conductor pad 90 and the passivation structure 45 have been formed. The conductor pad 90 may be composed of a variety of conductor materials, such as aluminum, copper, silver, gold, titanium, refractory metals, refractory metal compounds, alloys of these or the like. In lieu of a unitary structure, the conductor pad 90 may consist of a laminate of plural metal layers, such as a titanium layer followed by a nickel-vanadium layer followed by a copper layer. In another embodiment, a titanium layer may be covered with a copper layer followed by a top coating of nickel. However, the skilled artisan will appreciate that a great variety of conducting materials may be used for the conductor pad 90. Various well-known techniques for applying metallic materials may be used, such as physical vapor deposition, chemical vapor deposition, plating or the like. It should be understood that additional conductor structures could be used.

The passivation structure 45 may consist of alternating layers of dielectric materials, such as silicon dioxide and silicon nitride, and may be formed by well-known chemical vapor deposition (CVD) and/or oxidation or oxidation techniques. A suitable lithography mask 140 may be formed on the passivation structure 45 and by well-known lithography steps patterned with a suitable opening 145 in alignment with the conductor pad 90. Thereafter, one or more material removal steps may be performed in order to produce an opening 150 in the passivation structure 45 so that the conductor pad 90 is exposed. For example, the material removal steps may include one or more dry and/or wet etching processes suitable for the particular materials selected for the passivation structure 45. Following the material removal to yield the opening 150, the mask 140 may be stripped by ashing, solvent stripping or the like.

With the opening 150 established in the passivation structure 45 and the conductor pad 90 exposed, fabrication of the active terminal pad 85, the virtual pad 120 and the polymer film 80 can proceed. These steps can be performed in various orders. For example, application of the polymer film 80 can come before or after active terminal pad 85 and virtual pad 120 fabrication. In this illustrative embodiment and referring now to FIG. 5, the active terminal pad 85 and the virtual pad 120 may be fabricated before application of the polymer film 80 shown in FIG. 2. The active terminal pad 85 and the virtual pad 120 may be fabricated on the passivation structure 45 by physical vapor deposition, plating or other material formation techniques. Various conductor materials that exhibit favorable adhesion to the passivation structure and metallurgical bonding with other conductors may be used. Indeed, the same types of materials and techniques described in conjunction with the conductor structure 90 could be used for the active terminal pad 85 and the virtual pad 120 as well. In this exemplary embodiment, the active terminal pad 85 and the virtual pad 120 may be formed by physical vapor deposition of copper followed by a suitable etch, such as a phosphoric acid wet etch. Any fabrication process used should ensure that the gap 125 between the active terminal pad 85 and the virtual pad 120 is continuous to avoid shorts. A portion of the active terminal pad 85 fills the opening 150 in the passivation structure 45 and forms a metallurgical bond with the underlying conductor pad 90. If necessary, a preliminary native oxide strip etch may be performed to ensure that the surface of the conductor pad 90 is sufficiently exposed to enable metallurgical bonding with the active terminal pad 85.

Figure 6:
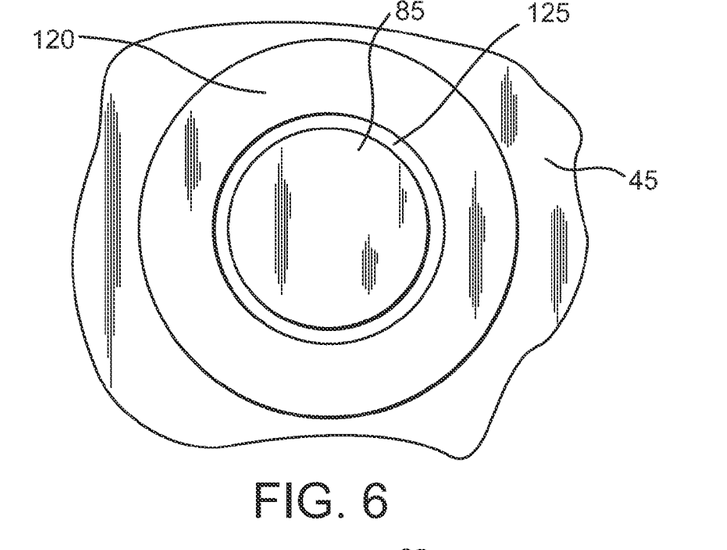
FIG. 6 is a plan view of the exemplary active terminal and virtual pads.

FIG. 6 is an overhead view of the active terminal pad 85 and virtual pad 120 following fabrication. In this illustrative embodiment, the active terminal pad 85 and virtual pad 120 may have the generally circular and ring shapes shown. The gap 125 between the active terminal pad 85 and the virtual pad 120 is continuous. It should be understood, however, that virtually any other shape besides circular and ring-like footprints may be used. Even a segmented structure could be used with the virtual pad 120.

Figure 7:
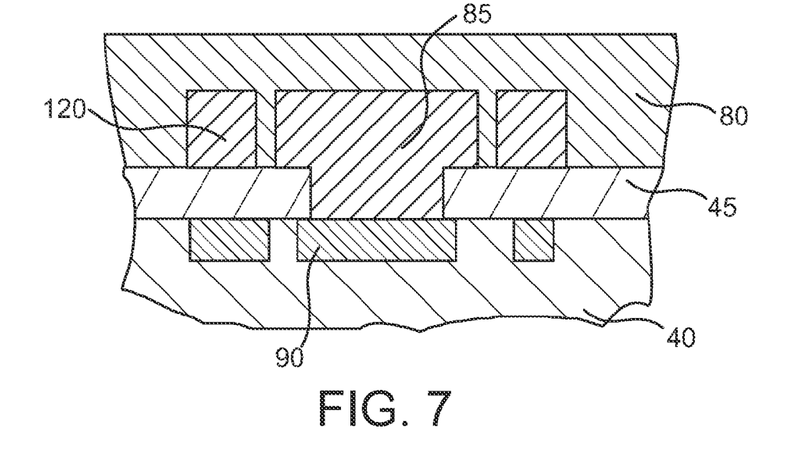
FIG. 7 is a sectional view like FIG. 5, but depicting application of a polymer film over the exemplary active terminal and virtual pads.

As shown in FIG. 7, the polymer film 80 is next applied over the active terminal pad 85, the virtual pad 120 and the exposed portions of the passivation structure 45. The polymer film 80 may be composed of polyimide, benzocyclobutene or the like, or other insulating materials such as silicon nitride or the like and may be deposited by spin coating, CVD or other techniques. A curing bake process may be performed after application. If an alternative process is used where the polymer film 80 is applied first, then it will be necessary to establish suitable openings (not shown) in the polymer film 80 to fabricate the active terminal pad 85 and virtual pad 120. This may be accomplished in a variety of ways depending on the composition of the polymer film 80. A polyimide polymer film 80 may be infused with a photoactive compound(s) lithographically patterned and subjected to material deposition or plating processes. If the polymer layer 45 is not capable of material removal by way of exposure and developing, then a suitable lithography mask may be applied and an etch performed to yield the requisite openings. Fabrication of structures to establish an electrical pathway from the semiconductor region 40, the conductor pad 90 and the active terminal pad 85 will now be described.

Figure 8:
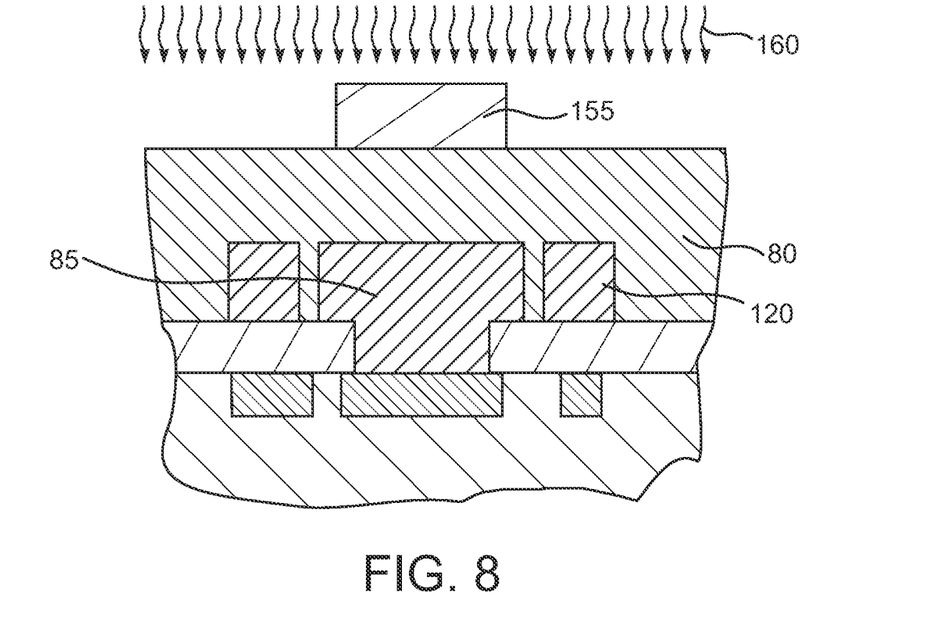
FIG. 8 is a sectional view like FIG. 7, but depicting exemplary lithographic masking and exposure of the polymer film.
Figure 9:
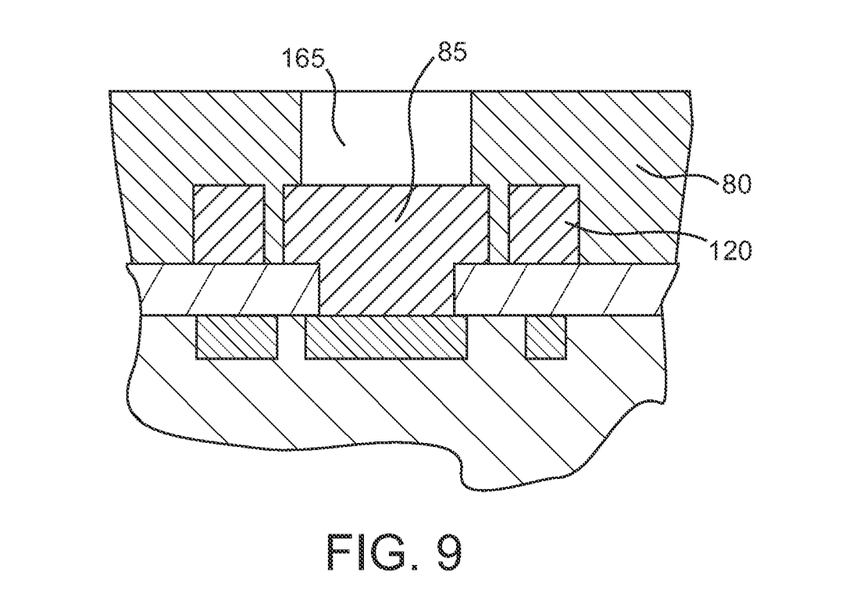
FIG. 9 is a sectional view like FIG. 8, but depicting exemplary lithographic fabrication of an opening in the polymer film.

Referring now to FIG. 8, the polymer film 80 may be lithographically patterned to establish a suitable opening for the later-formed UBM structure 75 shown in FIG. 2. This may be done in a variety of ways depending on the composition of the polymer film 90. A polyimide polymer film 80 may be infused with a photoactive compound(s) lithographically patterned and subjected to material deposition or plating processes. In this illustrative embodiment, the polymer film 80 does contain photoactive compounds. A non-contact mask 155 is positioned on the polymer film 80 in alignment with the active terminal pad 85 but without covering the virtual pad 120. An exposure with suitable radiation 160 is then performed. The portions of the polymer film 80 not covered by the mask 155 are rendered insoluble in a developer solution. Referring now to FIG. 9, the non-contact mask 155 shown in FIG. 8 is removed and the polymer film 80 developed to yield an opening 165 exposing a portion of and generally aligned with the active terminal pad 85. The virtual pad 120 remains covered. If the polymer layer 45 is not capable of material removal by way of exposure and developing, then a suitable lithography mask may be applied and an etch performed to yield the requisite opening.

Figure 10:
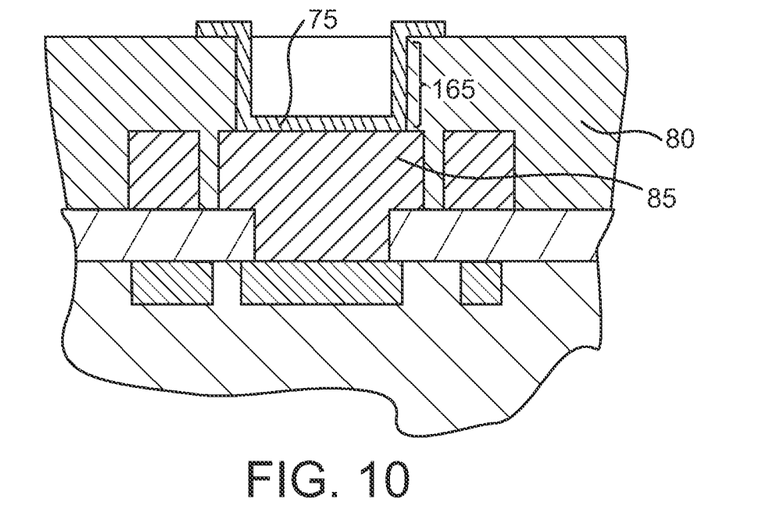
FIG. 10 is a sectional view like FIG. 9, but depicting fabrication of an exemplary underbump metallization structure.

The fabrication of the UBM structure 75 will now be described in conjunction with FIG. 10. The skilled artisan will appreciate that a UBM structure is designed to satisfy a few important objectives, namely, to bond to an overlying solder bump or other solder structure, to establish a conductive interface with an underlying conductor structure, in this case the active terminal pad 85, to bond as necessary with underlying or surrounding dielectrics, all while providing a barrier to the diffusion of solder constituents into underlying conductor structures, which might otherwise degrade those conductor structures. To satisfy these material requirements, UBM structures may use multiple films of different compositions depending on the type of solder application process. In this illustrative embodiment, the UBM structure 75 may be formed as a series of films applied in succession. For a printed solder bump, initially a titanium or titanium-tungsten film may be sputtered deposited on the polymer film 80 as well as along the sidewalls of the opening 165 and on the active terminal pad 85. The titanium film serves as an adhesion layer to readily adhere to the polymer film 80. Next, a barrier layer composed of nickel, nickel-vanadium or other materials is plated or otherwise deposited on the titanium film. Finally, a solder-wettable layer composed of copper, gold or other materials is applied to the nickel film by plating, sputter deposition or other techniques. Following material deposition, a wet etch is performed to yield the patterned UBM 75 as shown in FIG. 10. However, in the event that a bump plating process is used to establish later formed solder bumps, then the UBM structure 75 may consist of an adhesion layer of the type described above, followed by a plating seed layer, such as copper deposited by electroless plating or sputter deposition, followed by a nickel or nickel-vanadium barrier layer of the type described above. For a plated bump process, a wet etch is similarly performed. However, the barrier film of nickel may not need etch patterning.

Figure 11:
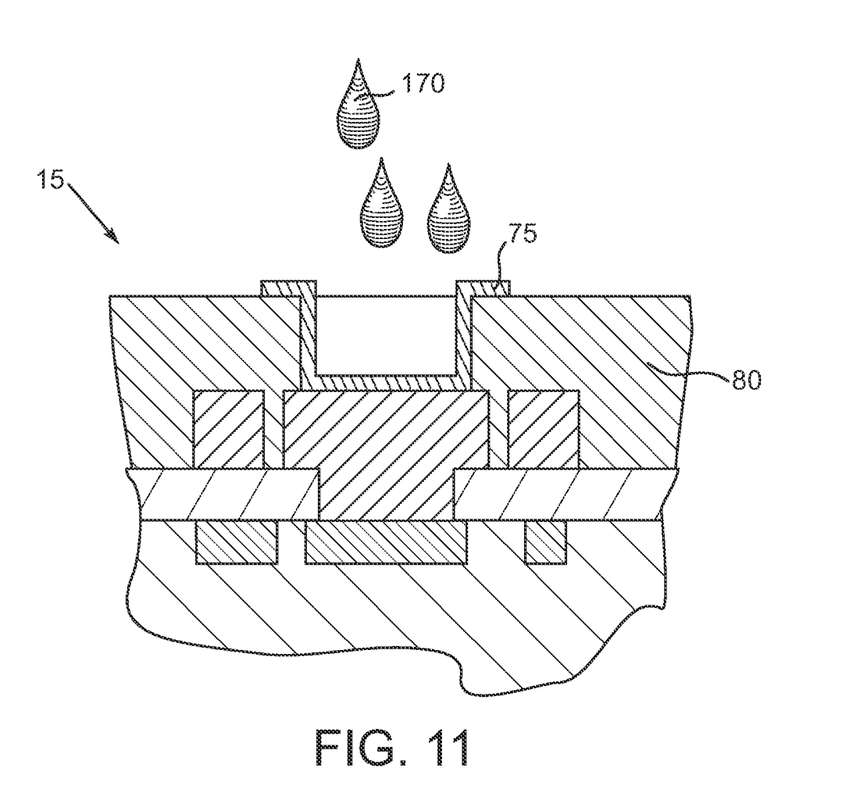
FIG. 11 is a sectional view like FIG. 10, but schematically depicting formation of a solder structure on the underbump metallization structure.

With the UBM structure 75 in place, a suitable solder material 170 may be printed, plated or otherwise positioned on the UBM structure 75 as shown in FIG. 11. The solder material 170, schematically depicted, is destined to become the solder bump 60 depicted in FIG. 2. A variety of processes may be used in conjunction with the deposited solder 170 in order to establish the solder bump 60 depicted in FIG. 2. In one illustrative embodiment, a printing process is used. At this point, a suitable lithography mask (not shown) may be applied to the polymer layer 80. The solder 170 is then deposited by a screen printing process. In an alternate exemplary embodiment, a plating process may be used. In this regard, a suitable lithography mask, not unlike the mask just described but not shown may be formed with an opening to expose the UBM structure 75. At this stage, the solder 170 may be plated to the UBM structure 75. Regardless of application technique, a thermal reflow of the semiconductor chip 15 follows to establish the bump 60 shown in FIG. 2.

Figure 12:
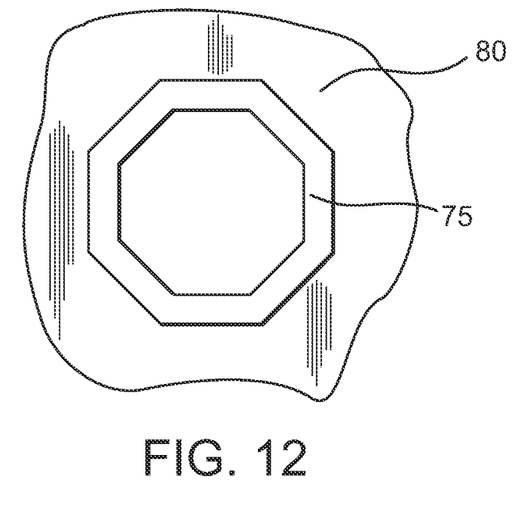
FIG. 12 is a plan view of the exemplary underbump metallization structure.
Figure 13:
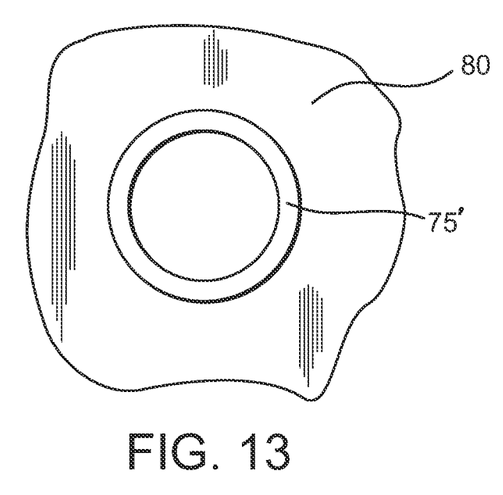
FIG. 13 is a plan view of an alternate exemplary underbump metallization structure.

FIGS. 12 and 13 depict successive plan views of embodiments of the UBM structure. FIG. 12 depicts the UBM structure 75 with a generally octagonal footprint. Note that just a small portion of the polymer film 80 is visible. FIG. 13 depicts a plan view of an alternate UBM structure 75' that has a generally circular footprint. Again, only a small portion of the polymer film 80 is depicted. Of course, the UBM structures 75 and 75' may take on a variety of different types of footprints.

Figure 14:
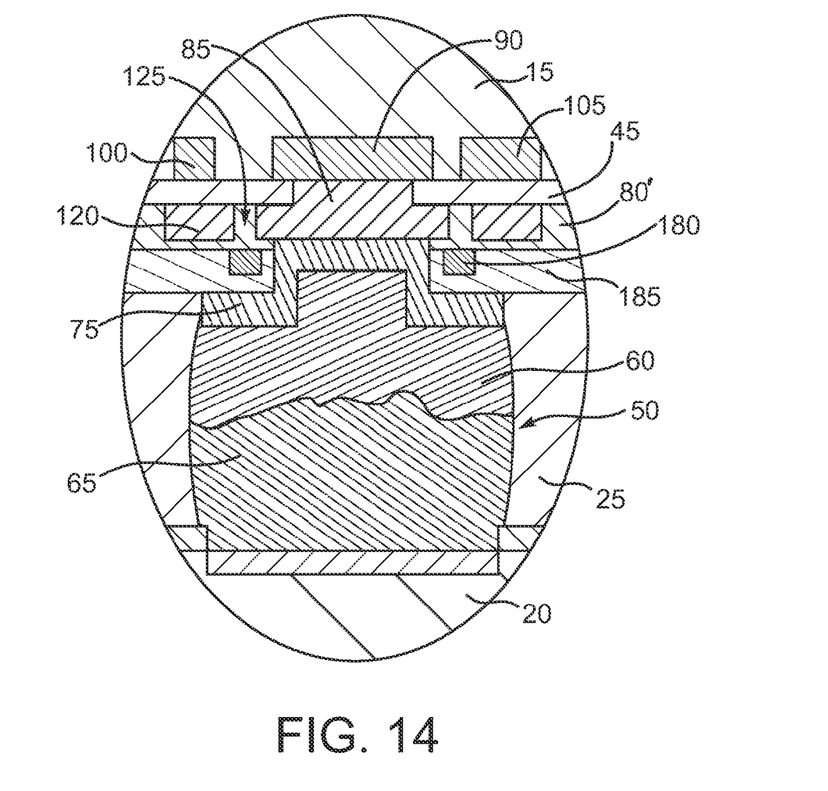
FIG. 14 is a sectional like FIG. 3, but of an alternate exemplary embodiment of a semiconductor chip.
Figure 15:
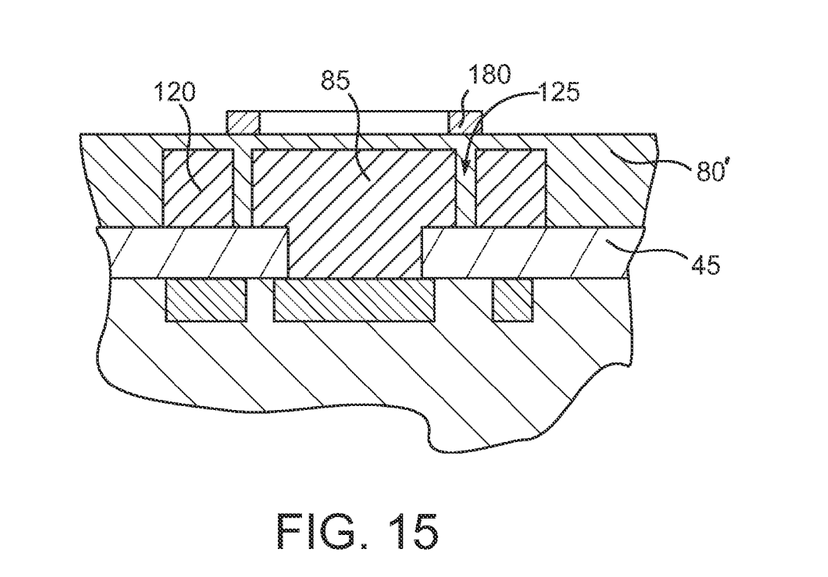
FIG. 15 is a sectional view depicting fabrication of exemplary active terminal and virtual pads, a polymer film and an additional virtual pad.

FIG. 14 is a sectional view like FIG. 3, but of an alternate exemplary embodiment and with traditional cross hatching included. This exemplary embodiment shares many characteristics of the embodiment described elsewhere herein and depicted generally in FIG. 2. Thus, the semiconductor chip 15 includes a plurality of conductor pads, one of which is shown and labeled 90 and active traces 100 and 105. A passivation structure 45 is positioned on the semiconductor chip 15 over the conductor traces 100 and 105 and at least partially over the conductor pad 90. The active terminal pad 85 and the virtual pad 120 may be configured and fabricated as generally described elsewhere herein. The polymer film 80' may be similarly fabricated as described elsewhere herein with an important caveat. In this illustrative embodiment, the polymer film 80' may be fabricated with a somewhat smaller thickness so that only a small portion of the polymer film 80' covers the virtual pad 120. The gap 125 may be as generally described elsewhere herein and thus filled with a portion of the polymer film 80'. However, this illustrative embodiment includes a second virtual pad 180 that is designed to provide stress support between the UBM structure 75 and the otherwise relatively compliant material a portion of the polymer film 80' positioned in the gap 125 that would otherwise bear upon the passivation structure. The fabrication of the embodiment disclosed in FIG. 14 may proceed generally as described above in conjunction with FIGS. 4-8 with a couple of notable differences. In the process flow associated with FIG. 8, the polymer film 80 has a substantial thickness of material above the active terminal pad 85 and the virtual pad 120. For the present alternative embodiment, the polymer film 80' is relatively thinner so that there is a thinner coating above the active terminal pad 85 and the virtual pad 120. At this stage and as depicted in FIG. 15, the second virtual pad 180 may be fabricated on the polymer film 80' using the same types of techniques to fabricate the active terminal pad 85 and the virtual pad 120, namely, physical vapor deposition, plating or other material application techniques along with material shaping techniques as described elsewhere herein. Note that the second virtual pad 180 overlies the gap 125 to protect the passivation structure 45. In terms of footprint, the second virtual pad 180 may be ring-like in shape as shown or other shapes. The second virtual pad 180 could be tied mechanically to the virtual pad 120 so long as the active terminal pad 85 is not shorted.

Figure 16:
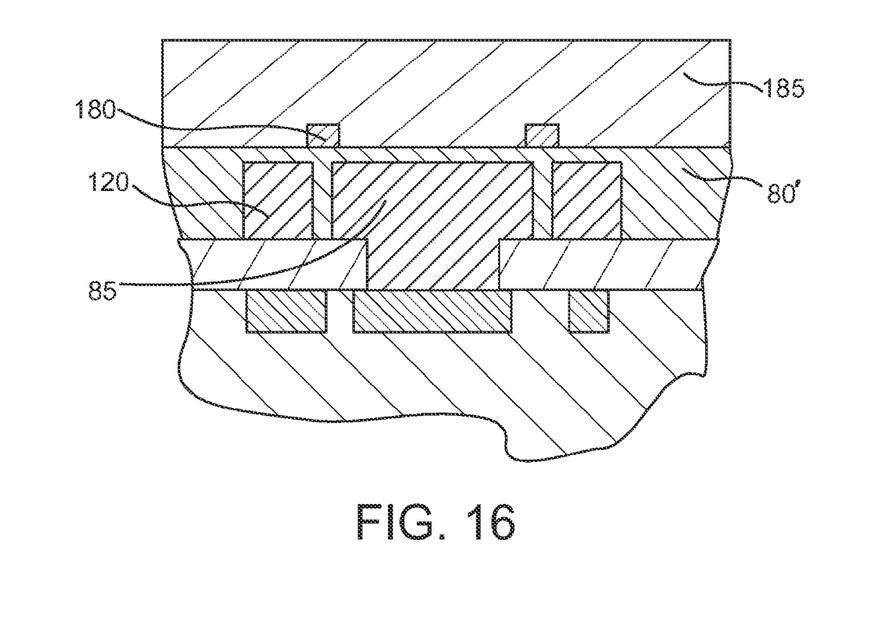
FIG. 16 is a sectional view like FIG. 15, but depicting fabrication of an exemplary additional polymer film on the first polymer film.

Referring now to FIG. 16, following the fabrication of the second virtual pad 180, an additional polymer film 185 may be formed on the polymer film 80' using materials and techniques described elsewhere herein for the polymer films 80 and 80'. Thereafter, the process flow may track the techniques described herein in conjunction with FIGS. 9-11 to establish the UBM structure 75 and the solder bump 60 and connection to the active terminal pad 85 but not the virtual pad 120, including the mounting of the circuit board 20, establishment of the solder joint 50 with the pre-solder 65 and underfill 25 deposition.

Figure 17:
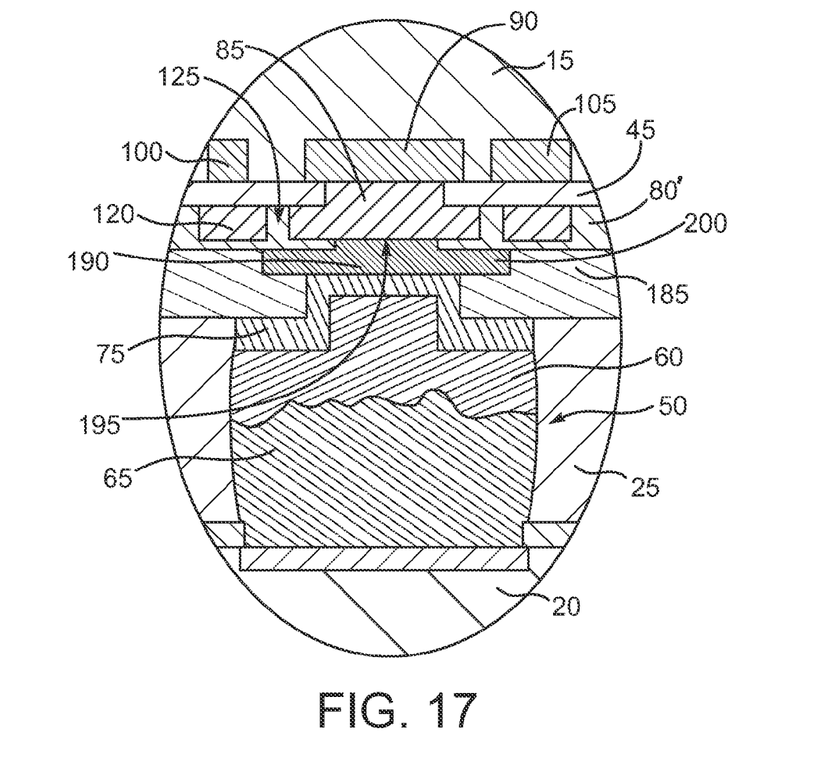
FIG. 17 is a sectional like FIG. 3, but of another alternate exemplary embodiment of a semiconductor chip.

FIG. 17 depicts a sectional view like FIG. 14, but of another alternate exemplary embodiment. This alternate embodiment shares many of the characteristics of the embodiment depicted in FIG. 14, namely, the semiconductor chip 15, the conductor pad 90, the conductor traces 100 and 105, the active terminal pad 85, the virtual pad 120 and the relatively thin polymer film 80'. However, to provide a desirable level of stress protection associated with the compliant material in the gap 125, the second virtual pad 180 depicted in FIG. 14 may be converted to what is in essence a non-virtual conductor pad 190 that has a central contact portion 195 to establish ohmic contact with the active terminal pad 85 and a flange portion 200 that is designed to be positioned on the polymer film 80' proximate the gap 125 to provide the requisite stress protection. The process flow to establish the alternate embodiments depicted in FIG. 17 may again track the process flow described elsewhere herein in conjunction with FIGS. 4-8 albeit with the proviso that the polymer film 80' is fabricated with a relatively smaller thickness than what is depicted in FIG. 8. At this stage, a suitable opening should be formed in the polymer film 80' and thereafter a material deposition or plating process used to fabricate the pad 190. Following the deposition and/or plating process, the pad 190 may be patterned by etching or other material removal techniques to the configuration depicted and thereafter an additional polymer film 185 may be formed over the polymer film 80' and the conductor pad 190. At this stage, the fabrication of the UBM structure 75 and the solder bump 60 and connection to the active terminal pad 85 but not the virtual pad 120, including the mounting of the circuit board 20, establishment of the solder joint 50 with the pre-solder 65 and underfill 25 deposition.

Any of the exemplary embodiments disclosed herein may be embodied in instructions disposed in a computer readable medium, such as, for example, semiconductor, magnetic disk, optical disk or other storage medium or as a computer data signal. The instructions or software may be capable of synthesizing and/or simulating the circuit structures disclosed herein. In an exemplary embodiment, an electronic design automation program, such as Cadence APD, Encore or the like, may be used to synthesize the disclosed circuit structures. The resulting code may be used to fabricate the disclosed circuit structures.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents and alternatives falling within the spirit and scope of the invention as defined by the following appended claims.

What is claimed is:

1. A method of manufacturing, comprising:
providing a semiconductor chip having a first conductor pad, wherein the first conductor pad is formed below a passivation structure;
fabricating a second conductor pad on the passivation structure and around but not in physical contact with the first conductor pad to leave a gap; and
fabricating an underbump metallization structure in electrical contact with the first conductor pad, the underbump metallization structure including a portion overlapping vertically with the second conductor pad whereby the second conductor pad is operable to protect a portion of the passivation structure from stress imparted by the overlapping portion.

2. The method of claim 1, wherein the second conductor pad extends completely around the first conductor pad.

3. The method of claim 1, wherein the underbump metallization structure has an octagonal footprint.

4. The method of claim 1, comprising coupling a solder structure to the underbump metallization structure.

5. The method of claim 4, wherein the solder structure comprises one of a solder bump and a solder joint.

6. The method of claim 4, comprising electrically coupling a circuit board to the solder structure.

7. The method of claim 6, wherein the circuit board comprises a semiconductor chip package substrate.

8. The method of claim 1, comprising forming the first and second conductor pads using instructions stored in a computer readable medium.

9. The method claim 1, comprising fabricating a polymer film on the semiconductor chip, and fabricating a third conductor pad on the polymer film proximate the gap to protect a portion of the passivation structure proximate the gap.

10. The method of claim 9, wherein the third conductor pad is not in physical contact with the second conductor pad.

11. A method of coupling a semiconductor chip to a circuit board, the semiconductor chip having a passivation structure, a first conductor pad and second conductor pad proximate to the first conductor pad, wherein the first conductor pad is formed below on the passivation structure, the first and second conductor pads separated by a polymer film to leave a gap, the first conductor pad in electrical contact with an underbump metallization structure that extends over and overlaps vertically with the second conductor pad but is separated therefrom by the polymer film, comprising:
    coupling a solder structure to the underbump metallization structure; and
    coupling the solder structure to the circuit board.

12. The method of claim 11, wherein the solder structure comprises one of a solder bump and a solder joint.

13. The method of claim 11, wherein the coupling the solder structure to the circuit board comprises coupling the solder structure to a presolder coupled to the circuit board.

14. The method of claim 11, wherein the circuit board comprises a semiconductor chip package substrate.

15. The method claim 11, comprising fabricating a third conductor pad on the polymer film proximate the gap to protect a portion of the passivation structure proximate the gap.

16. The method of claim 15, wherein the third conductor pad is not in physical contact with the second conductor pad.

17. An apparatus, comprising:
    a semiconductor chip having a first conductor pad, wherein the first conductor pad is formed below a passivation structure;
    a second conductor pad on the passivation structure and around but not in physical contact with the first conductor pad to leave a gap; and
    an underbump metallization structure in electrical contact with the first conductor pad, the underbump metallization structure including a portion overlapping vertically with the second conductor pad whereby the second conductor pad is operable to protect a portion of the passivation structure from stress imparted by the overlapping portion.

18. The apparatus of claim 17, wherein the second conductor pad extends completely around the first conductor pad.

19. The apparatus of claim 17, wherein the underbump metallization structure has an octagonal footprint.

20. The apparatus of claim 19, comprising a solder structure coupled to the underbump metallization structure.

21. The apparatus of claim 20, wherein the solder structure comprises one of a solder bump and a solder joint.

22. The apparatus of claim 17, comprising a circuit board coupled to the semiconductor chip.

23. The apparatus of claim 17, comprising a polymer film on the semiconductor chip and a third conductor pad on the polymer film proximate the gap to protect a portion of the passivation structure proximate the gap.

24. The apparatus of claim 23, wherein the third conductor pad is not in physical contact with the second conductor pad.

* * * * *